United States Patent
Vavrek et al.

(10) Patent No.: US 6,882,153 B2
(45) Date of Patent: Apr. 19, 2005

(54) GRADIENT COIL APPARATUS FOR MAGNETIC RESONANCE IMAGING

(75) Inventors: Robert Michael Vavrek, Waukesha, WI (US); Graeme Colin McKinnon, Hartland, WI (US); Daniel Joseph Schaefer, Waukesha, WI (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/709,016

(22) Filed: Apr. 7, 2004

(65) Prior Publication Data

US 2004/0189298 A1 Sep. 30, 2004

Related U.S. Application Data

(62) Division of application No. 10/065,422, filed on Oct. 16, 2002, now abandoned.

(51) Int. Cl.[7] .............................................. G01V 3/00
(52) U.S. Cl. ........................................ 324/322; 600/410
(58) Field of Search ................................ 324/322, 318, 324/307, 309, 312, 314; 600/410, 411, 422, 427

(56) References Cited

U.S. PATENT DOCUMENTS

| | | | |
|---|---|---|---|
| 4,165,479 A | 8/1979 | Mansfield | 324/0.5 A |
| 5,311,135 A | 5/1994 | Vavrek et al. | 324/318 |
| 5,736,858 A | 4/1998 | Katznelson et al. | 324/318 |
| 6,140,900 A | 10/2000 | Crozier et al. | 335/299 |
| 6,198,282 B1 | 3/2001 | Dumoulin | 324/307 |
| 6,198,289 B1 | 3/2001 | Du et al. | 324/322 |
| 6,255,821 B1 | 7/2001 | Oppelt | 324/318 |
| 6,418,336 B1 | 7/2002 | Kimmlingen et al. | 600/410 |
| 6,479,999 B1 | 11/2002 | DeMeester et al. | 324/318 |
| 6,501,977 B1 | 12/2002 | Kimmlingen | 600/410 |
| 6,538,443 B1 * | 3/2003 | Morich et al. | 324/318 |
| 6,545,473 B1 | 4/2003 | Gebhardt et al. | 324/318 |
| 6,628,979 B1 * | 9/2003 | Brand | 600/411 |
| 6,680,612 B1 * | 1/2004 | McKinnon et al. | 324/318 |

FOREIGN PATENT DOCUMENTS

| | | |
|---|---|---|
| EP | 0 766 095 B1 | 10/2000 |
| GB | 2 295 020 A | 5/1998 |

* cited by examiner

*Primary Examiner*—Louis Arana
(74) *Attorney, Agent, or Firm*—Cantor Colburn LLP

(57) ABSTRACT

A method for decreasing gradient field pulse sequence duration for a magnetic resonance imaging system, the method comprising: establishing an allowable gradient field strength for an axis of a plurality of axes for a field of view; applying a weighting factor associated with each axis of the plurality of axes; establishing a slew rate responsive to a selected axis of the plurality of axes that exhibits a largest gradient field strength in light of the weighting factor and the field of view; and operating the plurality of axes at the largest gradient field strength.

13 Claims, 8 Drawing Sheets

FIG. 8
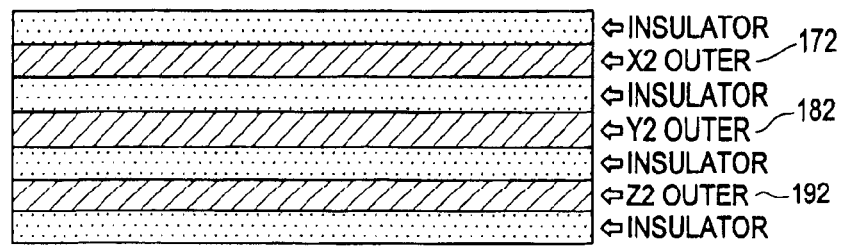
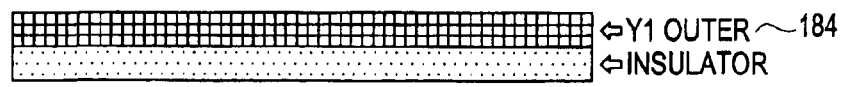
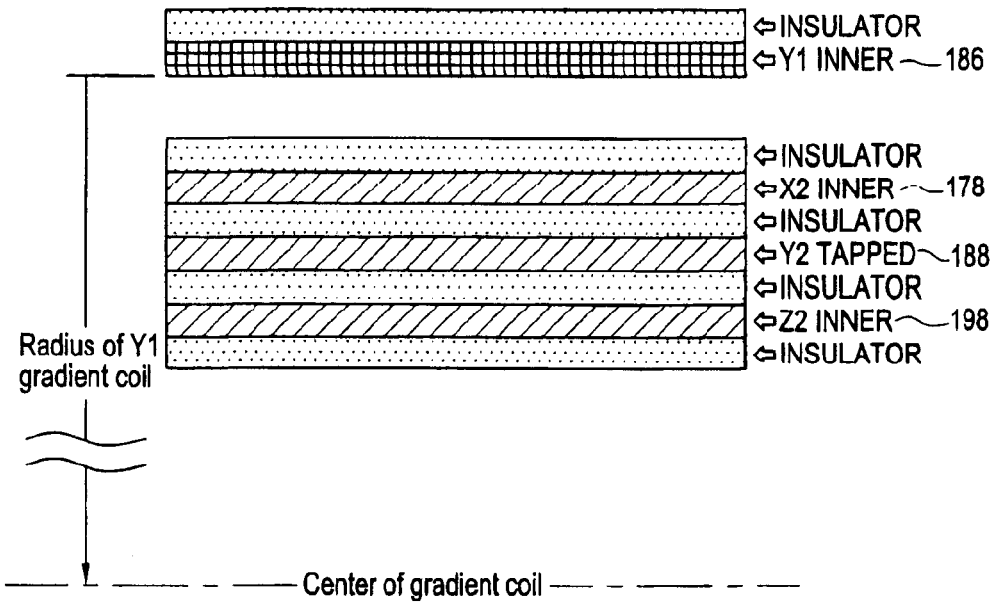

FIG. 9
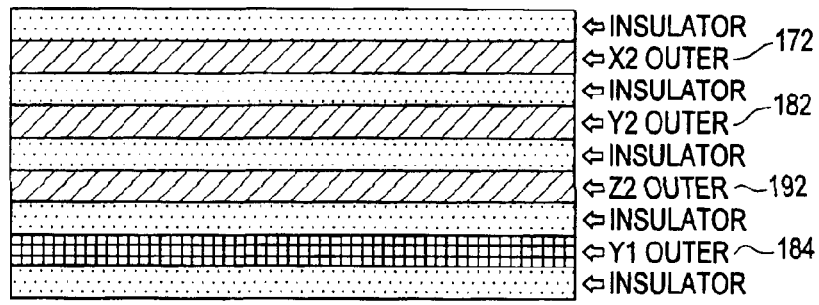
This drawing shows the Y1 axis coil position moved into the newly available space.
Reducing the Y1 axis inner coil diameter substantially increases its efficiency.
Moving the outer Y1 axis coil further away from the inner y axis coil also increases efficiency.
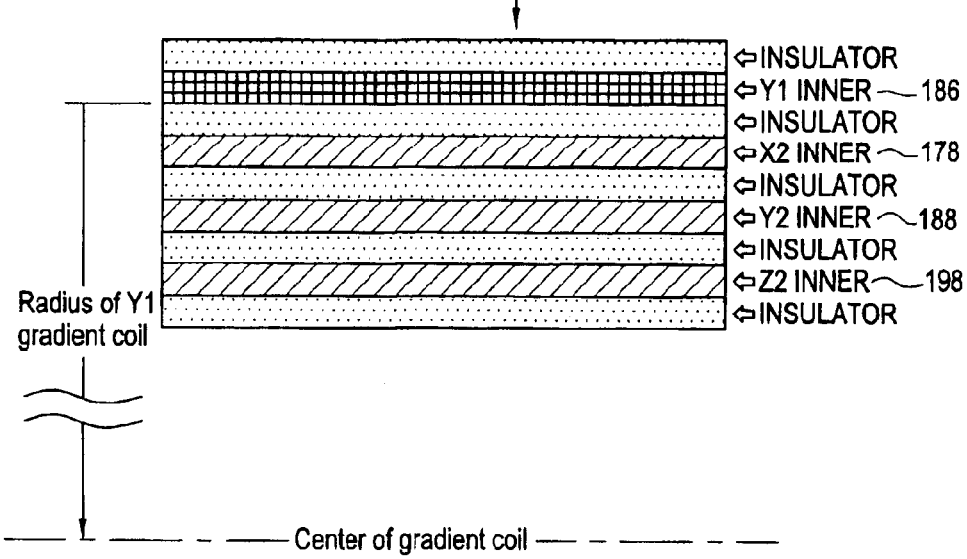

FIG. 10
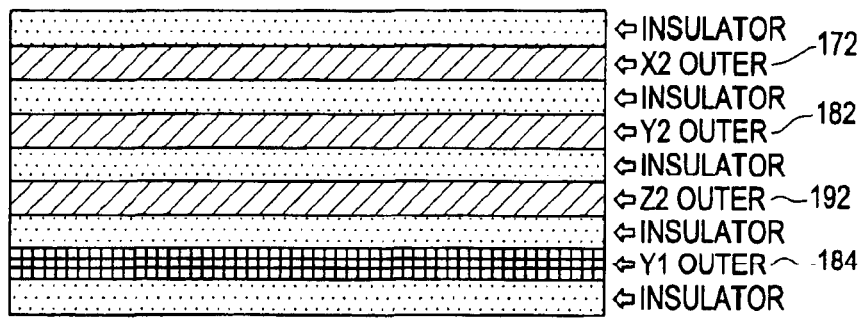
If the Y1 axis functionality is obtained by tapping the Y2 axis coil, then a separate inner Y1 axis coil is not needed.
A separate Y1 axis outer coil may still be needed due to the uniquely different fringe field pattern when the Y2 inner axis coil is in tapped mode.
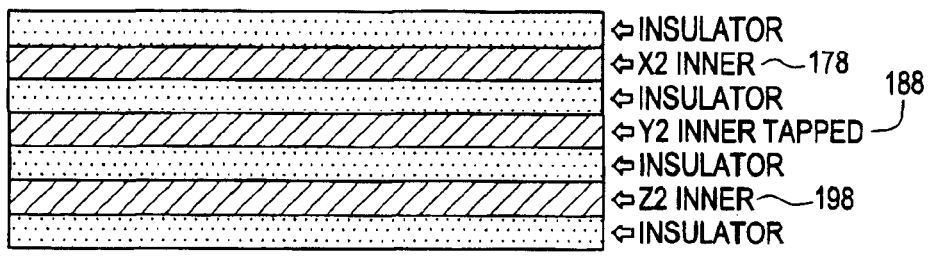

GRADIENT COIL APPARATUS FOR MAGNETIC RESONANCE IMAGING

CROSS REFERENCE TO RELATED APPLICATIONS

This application is a divisional application of U.S. patent application Ser. No. 10/065,422, filed Oct. 16, 2002, now abandoned, the contents of which are incorporated herein in their entirety.

BACKGROUND OF THE INVENTION

The field of the invention is nuclear magnetic resonance imaging methods and systems. More particularly, the invention relates to a method and apparatus system for formation of a gradient coil to allow for increased gradient slew rates and reduced peripheral nerve stimulation. It will be appreciated, however, that the-invention is also amenable to other like applications.

MR tomography is a known technique for acquiring images of the inside of the body of a living examination subject. To this end, rapidly switched magnetic gradient fields of high amplitude, which are generated by gradient coils, are superimposed on a static basic magnetic field. In the process of generating MR images, stimulations can be triggered in living examination subjects by the switching of the gradient fields. The gradient fields that influence the examination subject are characterized by a magnetic flux density that varies over time. The time-varying magnetic field generates eddy or induction currents in the examination subject. Their nature depends primarily on the shape and size of the microscopic structures. Due to electromagnetic interaction with tissue in the examination subject, these currents influence physiological currents, for instance potentials at cells. All cells have a resting potential. At resting potential, all membrane currents of a cell are in balance. When the membrane potential is depolarized by an additional membrane current, which is introduced into the cell by an outside influence, for example, this causes a potential change, known as an action potential. The actuating potential for an action potential is called a threshold. At the threshold, the balance of the membrane currents changes. Additional currents temporarily appear, which depolarize the membrane. An action potential is accompanied by an action. Thus, for example, each contraction of a muscle fiber is accompanied by an action potential in the muscle fiber, and each reaction of a sensory cell to a sensory stimulus is relayed by action potentials. Accordingly, due to the triggering of action potentials, switched gradient fields can lead to stimulations that are experienced as uncomfortable by the examination subject.

Due to the abovementioned physiological effects on the patient, constraints are placed on maximum gradient amplitudes and switching speeds (slew rate) for the gradient fields. As stated above, time-varying magnetic fields induce currents in conductive materials and rapidly changing magnetic field gradients can induce currents in a patient being imaged. Under some circumstances, these induced currents can stimulate nerves, a phenomenon known as peripheral nerve stimulation (PNST). Therefore, every MRI employed for human patients must conform to one or more magnetic field amplitude and rate of change limitations in accordance with FDA regulations. Thus, current MRI systems, therefore, assume the worst possible circumstances and limit the gradient slew rates amplitudes accordingly.

Most physiological limits placed on the gradient field rate of change are not a single fixed value. Instead, the limit changes as a function of the "transition time" (i.e. the time interval over which the change in gradient field occurs). The reason for allowing higher rates of change (i.e. dB/dt) as the transition time decreases is related to the fact that the electrical sensitivity of neurons decrease with increasing frequency. J. P. Reilly of the Johns Hopkins University Applied Physics Lab has modeled the response of nerve cells and produced an equation predicting the dB/dt threshold for peripheral (PNST) and cardiac nerve stimulation as a function of dB/dt and pulse duration. It should be noted that cardiac stimulation occurs at dB/dt levels about 10 times that of PNST, therefore, a wide margin of safety is realized. The Reilly PNST equation, known as the "Reilly Curve," is the basis for the FDA physiologic limits on dB/dt.

All gradient coil designs intended for human use will have a physiologic limit given by the Reilly equation. The slew rate, which gives the limit, however, will depend on the effective length of the coil. The physiologic slew rate limit is determined by dividing the Reilly limit by the effective length of the gradient coil, L. Note that, the effective length L is not necessarily the true length of the coil. The effective coil length is the ratio of the maximum field strength in milliTesla (mT) found within the gradient coil divided by the applied gradient strength (mT/m). While the effective coil length has units of length, it does not relate to any physical dimension within the coil. It should not be confused with the distance from the iso-center of the gradient coil to the location of maximum field variation. Maximum field strength is defined as the vector sum of all three components of field produced by the gradient coil axis.

There are known methods for predicting these nerve stimulations. One of these methods for monitoring stimulations is based on the so-called "dB/dt model". In this method the values, which occur in an MR tomography process, of the time variation of magnetic flux density of gradient fields (dB/dt values) are checked and monitored. The maximum allowable dB/dt values result from a stimulation study with the corresponding gradient coils, or from limit values that have been strictly prescribed by regulatory authorities such as the FDA.

The triggering of stimulations for a selected gradient configuration depends, basically, on the type of measurement sequence. It is necessary to distinguish between sequences known as conventional measuring sequences and sequences known as rapid measuring sequences. Conventional measuring sequences usually demand a high linearity of the gradient fields within a definite linearity volume, for instance 5% in a linearity volume of 40 to 50 cm given moderate gradient strengths of 10 to 20 milliTesla/meter (mT/m) and switching times of approximately 1 millisecond. However, for rapid measuring sequences, high gradients, for instance 20 to 40 mT/m, are switched very rapidly (switching times approx. 100 to 500 microseconds). The time-varying magnetic flux density of the gradient fields induces electrical currents in the examination subject, which can trigger nerve stimulations of the subject. With faster time variations, that is, faster switching times and larger values of magnetic flux density of gradient fields, the induced currents are greater, and the likelihood of nerve stimulations increases. The largest values in absolute terms are attained at the margins and outside the linearity volumes, where the maximum field deviation or excursion also occurs. Given defined requirements on the size of the gradients and the switching time, the field deviation, and thus the risk of stimulation, can be reduced by using a gradient coil with a smaller linearity volume. Thus, in rapid measuring sequences, the linearity volume of typically 40 to 50 cm drops to 20 cm, for example. A gradient coil with the above-described characteristics for rapid measuring sequences typically is not suitable for conventional whole-body applications, but rather for rapid MR imaging techniques such as described in U.S. Pat. No. 4,165,479 and what are known as turbo-spin methods.

The UK patent application GB 2,295,020 describes a modular gradient coil system that unites, in one coil body, a gradient coil for rapid measuring sequences and an activatable gradient coil for conventional measuring sequences. The gradient coil for rapid measuring sequences has a small linearity volume and allows rapid switching of gradient fields with large gradients. In the joint operation of the two coils, the gradient coil system has a large linearity volume for conventional measuring sequences with slowly switched gradient fields and given small gradients. This has the disadvantage that, with the selection of a rapid or conventional measuring sequence, an imaging region is defined corresponding to the appertaining linearity volume. The imaging region for rapid measuring sequences is always a definite small sub-region, which is strictly prescribed by the coil arrangement, of the larger imaging region for conventional measuring sequences, with the midpoint of the two imaging regions being identical. To pick up MR images with rapid measuring sequences for an imaging region extending over the imaging region for conventional measuring sequences, the examination subject would have to be moved in all three directions in space. Due to the geometry of the MR tomography device, however, it is only possible to shift the examination subject in one direction.

Furthermore, U.S. Pat. No. 5,311,135 teaches a gradient coil for a magnetic resonance device which has four saddle-shaped coils, each of which has first and second terminal points respectively at the beginning and end of its conductor, as well as at least one tapping point between the terminal points. The arrangement also includes a switching mechanism, so that each of the coils can be supplied with current either between the terminal points or between the first terminal point and the tapping point. In this way, at least two different linearity volumes of the gradient coils can be set, for instance corresponding to a size of a region that is being imaged.

A gradient coil with at least two independently controllable portions, with multiple control states for generating a gradient field for imaging multiple regions is described in U.S. Pat. No. 6,418,336 to Kimmlingen et al. In this patent, by controlling gradient fields for at least two imaging sub-regions, with neither of the two regions being a subset of the other, it is possible to pick up MR images for a larger aggregate imaging area, which derives at least from the sum of the two imaging sub-regions, using rapid, high-resolution measuring sequences without triggering stimulations.

Configurations of gradient coils that employ extra "twin" or excess coils are costly and complicated. Moreover, such coils utilize additional space limiting space for cooling and shaping to address other design parameters. Therefore, there is a need in the art for a gradient coil design that addresses current regulatory requirements for field strength and slew rate requirements without excessive complication and cost.

BRIEF DESCRIPTION OF THE INVENTION

The above discussed and other drawbacks and deficiencies are overcome or alleviated by a gradient coil assembly for a magnetic resonance imaging system comprising: a first gradient coil configured to generate a first gradient field in a first field of view; a second gradient coil configured to generate a second gradient field orthogonal to the first gradient field in a second field of view; and a third gradient coil configured to generate a third gradient field orthogonal to the first gradient field and the second gradient field in a plurality of fields of view.

Also disclosed herein is a gradient coil assembly for a magnetic resonance imaging system comprising: a first gradient coil configured to generate a first gradient field in a single field of view; a second gradient coil configured to generate a second gradient field orthogonal to the first gradient field in at least one field of view; and a third gradient coil configured to generate a third gradient field orthogonal to the first gradient field and the second gradient field in a plurality of fields of view. Where, in this gradient coil assembly, at least one of the first gradient coil and the second gradient coil comprise only a single coil and the third gradient coil comprises a plurality coils configured to generate the plurality of fields of view.

Additionally, disclosed herein is a method for decreasing gradient field pulse sequence duration for a magnetic resonance imaging system, the method comprising: establishing an allowable gradient field strength for an axis of a plurality of axes for a field of view; applying a weighting factor associated with each axis of the plurality of axes; establishing a slew rate responsive to a selected axis of the plurality of axes that exhibits a largest gradient field strength in light of the weighting factor and the field of view; and operating the plurality of axes at the largest gradient field strength.

Likewise, also disclosed herein is a method for reducing peripheral nerve stimulation for a magnetic resonance imaging system, the method comprising: establishing an allowable gradient field strength for an axis of a plurality of axes for a field of view; applying a weighting factor associated with each axis of the plurality of axes; establishing a slew rate responsive to a selected axis of the plurality of axes that exhibits a largest gradient field strength in light of the weighting factor and the field of view; and operating the plurality of axes at the largest gradient field strength.

In yet another embodiment, disclosed herein is a system for decreasing gradient field pulse sequence duration and/or reducing peripheral nerve stimulation in a magnetic resonance imaging system, comprising: a magnetic resonance imaging system including a gradient coil assembly for a magnetic resonance imaging system comprising: a first gradient coil configured to generate a first gradient field in a first field of view; a second gradient coil configured to generate a second gradient field orthogonal to the first gradient field in a second field of view; and a third gradient coil configured to generate a third gradient field orthogonal to said first gradient field and the second gradient field in a plurality of fields of view.

Further disclosed herein is a system for decreasing gradient field pulse sequence duration and/or reducing peripheral nerve stimulation with known gradient pulse areas for a magnetic resonance imaging system, the method comprising: a means for establishing an allowable gradient field strength for an axis of a plurality of axes for a field of view; a means for applying a weighting factor associated with each axis of the plurality of axes; a means for establishing a slew rate responsive to a selected axis of the plurality of axes that exhibits a largest gradient field strength in light of the weighting factor and the field of view; and a means for operating the plurality of axes at the largest gradient field strength.

Finally, disclosed herein is a storage medium encoded with a machine-readable computer program code; the code including instructions for causing a computer to implement a method for reducing peripheral nerve stimulation for a magnetic resonance imaging system, as well as a computer data signal comprising code configured to cause a processor to implement a method the method comprising: establishing an allowable gradient field strength for an axis of a plurality of axes for a field of view; applying a weighting factor associated with each axis of the plurality of axes; establishing a slew rate responsive to a selected axis of the plurality of axes that exhibits a largest gradient field strength in light of the weighting factor and the field of view; and operating the plurality of axes at the largest gradient field strength.

The above discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several Figures:

FIG. 8 depicts the gradient coil configuration employing an exemplary embodiment to eliminate selected coils;

FIG. 9 depicts a cross-section of a gradient coil assembly of an exemplary embodiment; and FIG. 10 depicts a cross-section of a gradient coil assembly of an alternative embodiment.

DETAILED DESCRIPTION OF THE INVENTION

Disclosed herein is another MRI method and system including a gradient coil that facilitates MR imaging avoiding peripheral nerve stimulation (PNST). The method includes a gradient coil configuration that comports with a more accurate assessment of field strength and slew rate limitations as identified by current regulatory standards.

To improve MR methods and scans, it is desirable to minimize the duration of the gradient pulses. Increasing the slew rate will have the effect of reducing pulse duration. However, as mentioned earlier, important physiological limits must be considered. Slew rates that create dB/dt above threshold levels, established for example by the Reilly equation, may induce nerve stimulation in patients. For any gradient coil, dB/dt is directly proportional to the slew rate and ramp time duration, and varies as a function of position in and around the gradient coil. The geometry of the coil will also have a substantial effect. For example, the maximum dB/dt in a small FOV cylindrical coil will be lower than the maximum dB/dt in a large FOV coil, all other factors, such as linearity over the FOV, being the same. Hence, the desire for greater linearity and FOV conflicts with the desire to minimize PSNT. The decision which to favor depends upon the particular application, such as cardiac imaging or abdomen imaging. Since both applications are typically done on one scanner, one solution has been to provide two sets of gradient coils within the same scanner. Therefore, disclosed herein is a coil configuration that addresses the considerations of PNST and yet facilitates utilizing increased amplitudes and slew rates.

Figure 1:
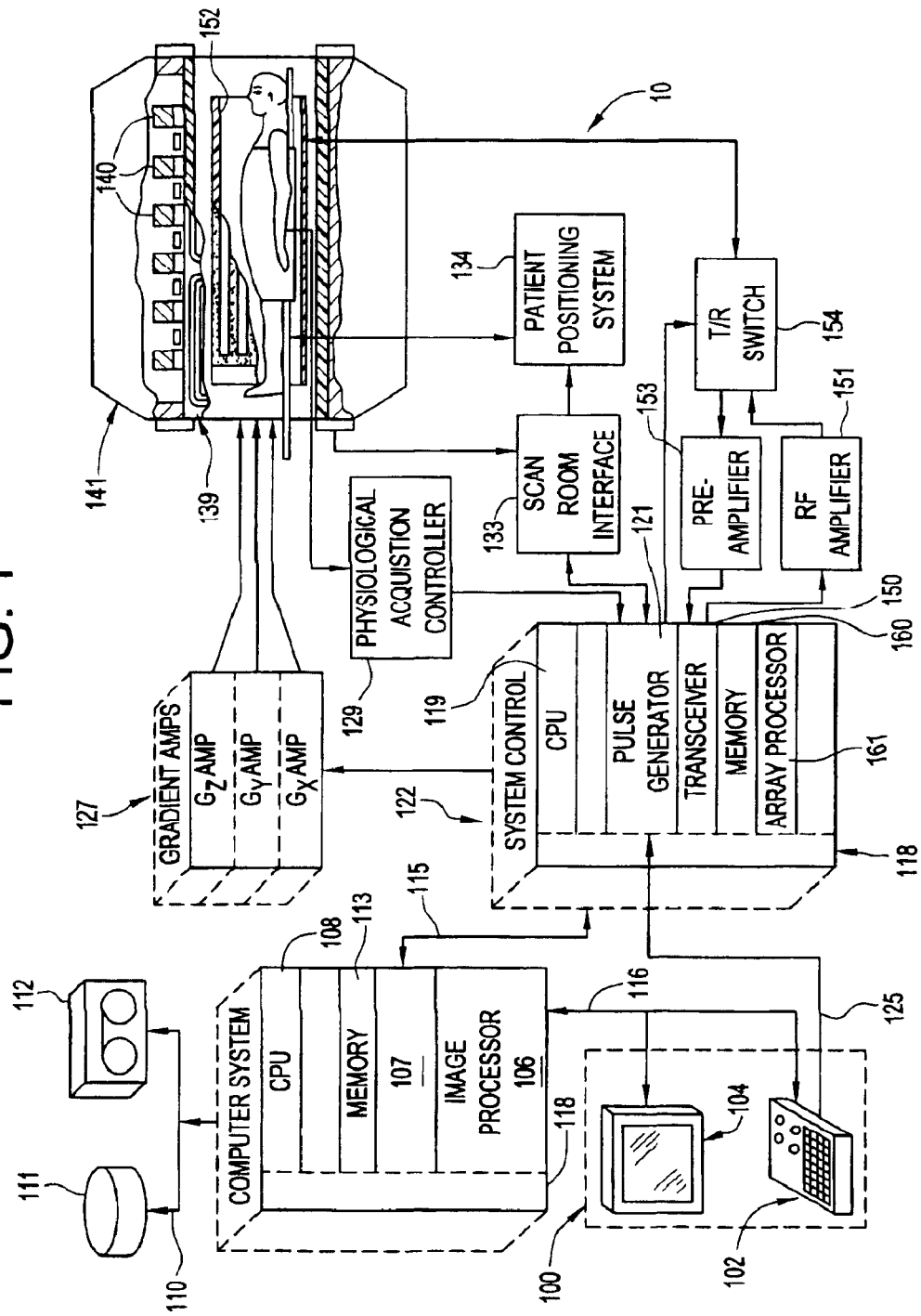
FIG. 1 depicts an exemplary MRI system.

Referring to FIG. 1, there is shown the major components of an exemplary MRI system, within which an exemplary embodiment may be implemented. The operation of the system is controlled from an operator console 100, which includes a keyboard and control panel 102 and a display 104. The console 100 communicates through a link 116 with a separate computer system 107 that enables an operator to control the production and display of images on the screen 104. The computer system 107 includes a number of modules, which communicate with each other through a backplane. These include an image processor module 106, a CPU module 108 and a memory module 113, known in the art as a frame buffer for storing image data arrays. The computer system 107 is linked to storage media 111 and 112, depicted as disk storage and a tape drive respectively for storage of image data and programs, and it communicates with a separate system control 122 through a high speed serial link 115.

The system control 122 includes a set of modules connected together by a backplane 118. These include a CPU module 119 and a pulse generator module 121, which connects to the operator console 100 through a serial link 125. It is through this link 125 that the system control 122 receives commands from the operator that indicate the scan sequence that is to be performed. As will be described in more detail below, the operator enters parameters, which indicate the prescribed scan. From these parameters, a pulse sequence is calculated and downloaded to the pulse generator module 121.

The pulse generator module 121 operates the system components to carry out the desired scan sequence. It produces data, which indicates the timing, strength and shape of the RF pulses that are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. Finally, the pulse generator module 121 connects to a scan room interface circuit 133, which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier 127 comprised of $G_x$, $G_y$, and $G_z$ amplifiers. Each gradient amplifier 127 excites a corresponding gradient coil (not shown) in an assembly generally designated 139 to produce the magnetic field gradients used for position encoding acquired signals. The gradient coil assembly 139 forms part of a magnet assembly 141, which includes a polarizing magnet 140 and a whole-body RF coil 152. A transceiver module 150 in the system control 122 produces pulses, which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the RF coil 152 during a transmit mode and to connect the preamplifier 153 during a receive mode. The transmit/receive switch 154 also enables a separate RF coil 152 (for example, a head coil or surface coil) to be used in either the transmit mode or receive mode.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in a storage medium 111 or 112 such as disk memory or tape drive. The storage medium 111 and 112 could be various storage methodologies, such as disk, static memory, solid state, removable media, and the like, as well as combinations including at least one of the foregoing. In response to commands received from the operator console 100, this image data may be archived on the tape drive, or it may be further processed by the image processor 106, and conveyed to the operator console 100 and presented on the display 104.

Referring still to FIG. 1, the NMR signal produced by the subject is picked up by the receiver coil 152 and applied through the preamplifier 153 to the input of a transceiver 150. The received signal is at or around the Larmor frequency, and this high frequency signal is down converted in a two-step process, which first mixes the NMR signal with a carrier signal and then mixes the resulting difference signal with a reference signal. The down converted NMR signal is applied to the input of an analog-to-digital (A/D) converter, which samples and digitizes the analog signal and applies it to a digital detector and signal processor which produces in-phase (I) values and quadrature (Q) values corresponding to the received NMR signal. The resulting stream of digitized I and Q values of the received signal are output through backplane 118 to the memory module 160 and array processor 161 where they are employed to reconstruct an image.

Figure 2:
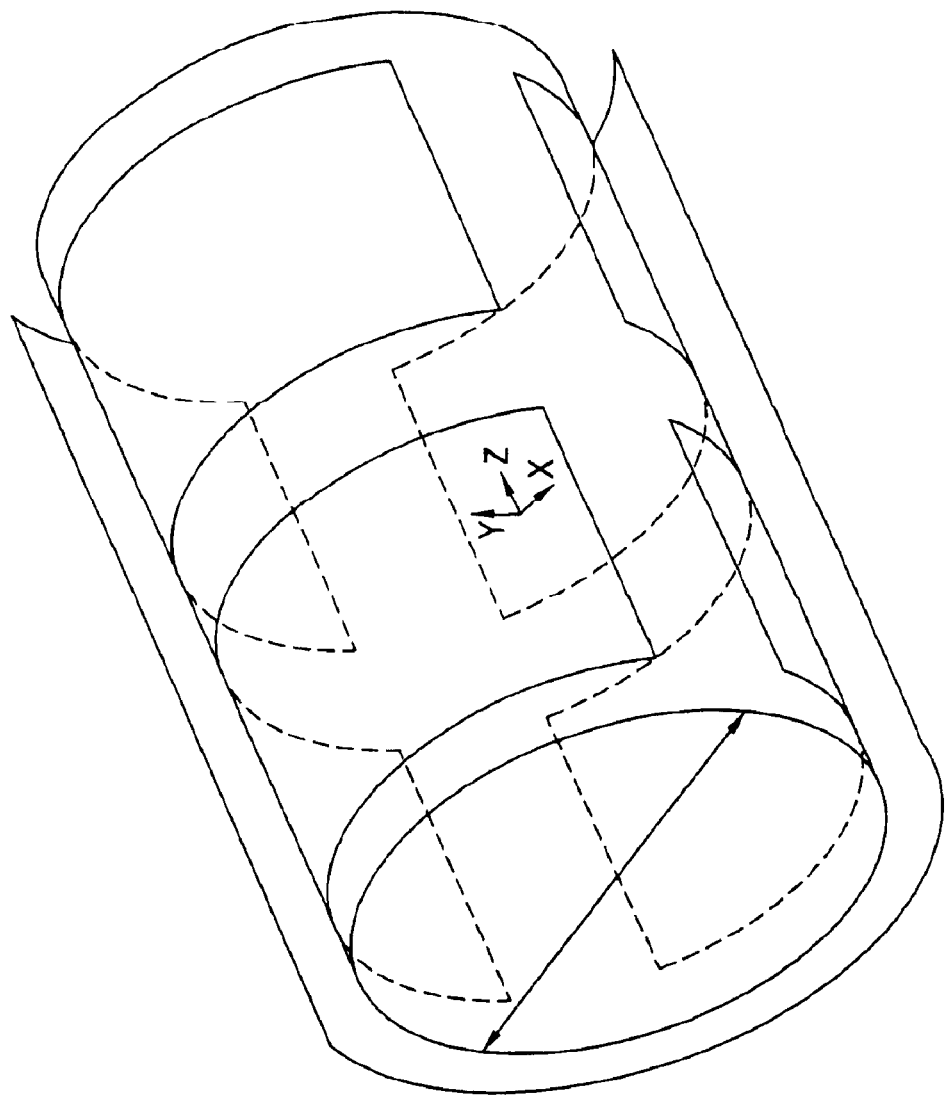
FIG. 2 depicts an existing gradient coil design utilizing multiple coils in more than one axis.

Turning now to FIG. 2, an existing configuration for a gradient coil is depicted including multiple coils for several axes. Such a configuration facilitates maintaining linear region of magnetic field gradient to be reduced or enlarged as desired to conform to a selected size of a region of interest. Additionally, such a configuration facilitates reductions of the magnetic field utilized when imaging smaller regions and conversely, larger magnetic fields within smaller regions of interest, and thereby reduced imaging durations.

Disclosed herein is another MRI method and system including a gradient coil that facilitates MR imaging avoiding peripheral nerve stimulation (PNST). The method includes a gradient coil configuration that comports with a more accurate assessment of field strength and slew rate limitations as identified by current regulatory standards. Therefore, by more accurately addressing field strength and field slew rate limitations, a simplified and more efficient gradient coil design can be developed while still avoiding PNST. The resulting higher field strengths and/or faster field slew rates may be employed and thereby, imaging durations reduced.

The International Electrotechnical Commission (IEC) standard for medical equipment 60601-2-33 establishes limits for magnetic field strength and slew rates. IEC 60601-2-33 is the international standard for the safety of magnetic resonance equipment intended for medical diagnosis. Evaluation of the limits imposed by IEC 606601-2-33 it becomes apparent that physiological effects such as nerve stimulation are most sensitive to excitation in gradient field slew rates denoted dB/dt in the anterior/posterior (A/P) direction. This sensitivity per gradient orientation is recognized and accounted for in the established weighting factors for control of Gradient Output. When the Gradient Output O is obtained by weighted quadratic addition from each of the three gradient axes $O_i$, the equation is:

$$O = \sqrt{\Sigma(w_{iO_i})^2}$$

Weighting factors less than one allow a greater gradient axis output compared to using the default values.

Table 1 identifies various weighting factors from the standard for a given gradient system configuration.

TABLE 1

Weighting factors For MR Gradient System

| Type of Gradient System | | Weight Factors | | |
|---|---|---|---|---|
| | | $W_{AP}$ Y | $W_{LR}$ X | $W_{HF}$ Z |
| Whole Body Gradient System | Default | 1.0 | 1.0 | 1.0 |
| | Cylinder Magnets | 1.0 | 0.8 | 0.7 |
| | Empirical Determination | 1.0 | N/A | N/A |

To facilitate disclosure of an exemplary embodiment, comparison may be made to an exemplary configuration formulated without regard to constraints from PNST. In this configuration, the effective coil length is approximately the same for each axis, and therefore, using the default weighting factors, the effective coil length remains approximately the same for each axis, yielding a default or nominal slew rate that is the same for all three axes. However, applying the weighting factors from Table 1 to the same gradient coil yields a considerable effective coil length reduction for the X and Z-axes. Table 2 depicts the effective coil lengths with the weighting factors applied.

TABLE 2

Effective Coil Lengths For MR Gradient System

| Gradient System Axis | Effective Coil Length (cm) | Weight Factors | Apparent Effective Coil Length (cm) |
|---|---|---|---|
| X - WB | 35.2 | 0.8 | 28.2 |
| Y - WB | 35.4 | 1.0 | 35.4 |
| Z - WB | 38.0 | 0.7 | 26.6 |
| Maximum | 38.0 | | 35.4 |

WB = whole body, high linearity

In many MRI systems, it is desirable to utilize the same slew rates for all three axes. Therefore, despite the potential for operating at higher amplitudes/slew rates, two of the axes, would not. For example, as depicted in the table the Y-axis would determine the limitation for maximum operating amplitude/slew rate, while the X and Z-axes would unnecessarily be operated at lower levels. Therefore, for a "twin" type gradient coil only the Y-axis low linearity (zoom) coil is needed. Therefore, switching to a zoom coil for just the Y-axis coil, allows all three axes to operate at a higher slew rate. Table 3 depicts the effective coil lengths employing the substitution for the Y-axis.

TABLE 3

Effective Coil Lengths For MR Gradient System

| Gradient System Axis | Effective Coil Length (cm) | Weight Factors | Apparent Effective Coil Length (cm) |
|---|---|---|---|
| X - WB | 35.2 | 0.8 | 28.2 |
| Y - Zoom | 28.7 | 1.0 | 28.7 |
| Z - WB | 38.0 | 0.7 | 26.6 |
| Maximum | 38.0 |  | 28.7 |

WB = whole body, high linearity
Zoom = small FOV, lower linearity

In an exemplary embodiment a gradient coil assembly is disclosed that is preferably optimized for whole body, wider FOV, high linearity, with the Y-axis gradient coil employing either a supplemental coil to provide reduced effective coil length, or tapped windings such that some of the Y-axis gradient coil may be switched out. In either approach, an additional shield is also employed for the second Y-axis geometry employing a lower linearity Y-axis gradient coil. This approach is beneficial in that it provides a less complicated, less expensive, coil configuration than existing "twin" coil designs. In a "zoom" mode, only the linearity/FOV for the Y-axis is compromised, the X and Z-axes will retain higher linearity. The simpler coil configuration for the X and Z-axes results in additional space, as the "zoom" coil for these axes is no longer needed. The additional space may be employed to optimize other parameters, such as improved cooling.

Figure 3:
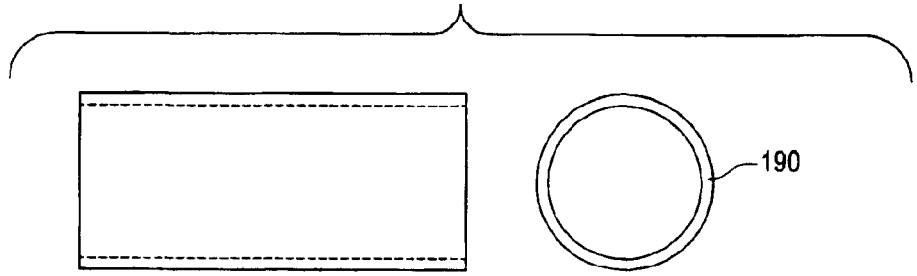
FIG. 3 depicts a representation of a gradient coil as a thick walled cylinder.
Figure 4:
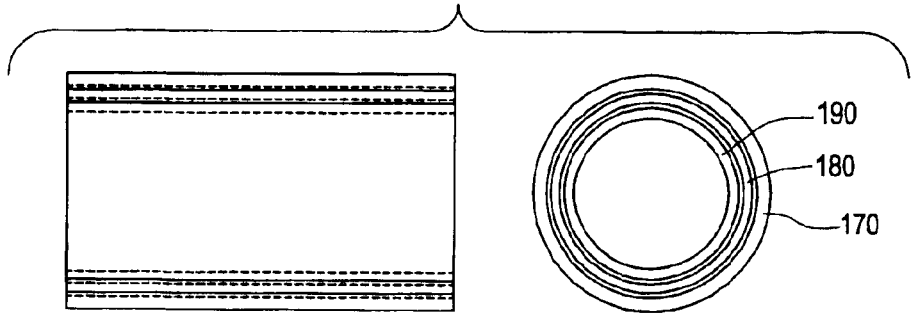
FIG. 4 depicts a representation of three gradient coils as three nested thick walled cylinders.
Figure 5:
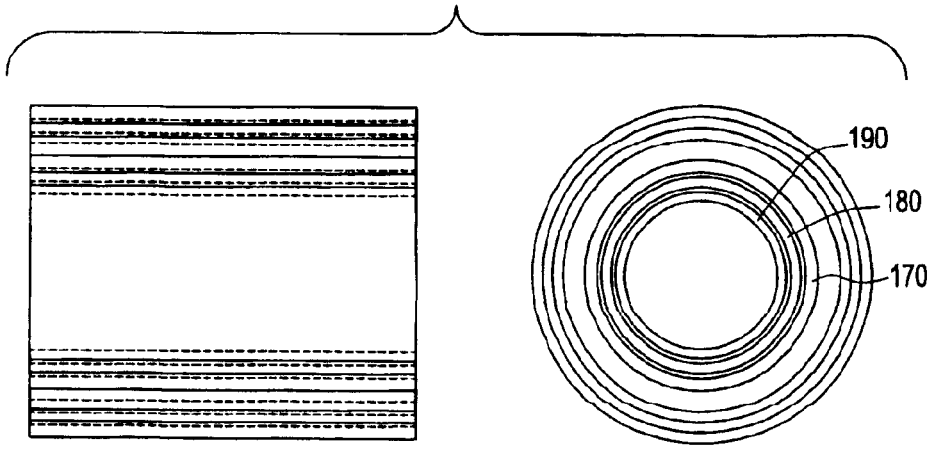
FIG. 5 depicts a representation for three self-shielded gradient coils including an additional set of three cylinders at a larger diameter to represent the shielding coils.

Referring now to FIG. 3, a gradient coil may be represented as a thick walled cylinder, in this instance, for example, the Z-axis coil is denoted as 190. To add a gradient coil for each of three axes, X, Y, and Z, three nested cylinders provide an exemplary representation. FIG. 4 depicts a representation of three gradient coils denoted as, first, 190, third 180, and second, 170 for the Z, Y, and X axes respectively as three nested thick walled cylinders. Turning now to FIG. 5, for a self-shielded gradient coil, there will be yet another set of three cylinders at a larger diameter to represent the shielding coil. Finally, for a "twin" or dual field of view gradient coil configuration, the number of coils would double over that depicted in FIG. 5. For simplicity, a cross section of the nested cylinders may now be employed to further discussion of an exemplary embodiment.

Figure 6:
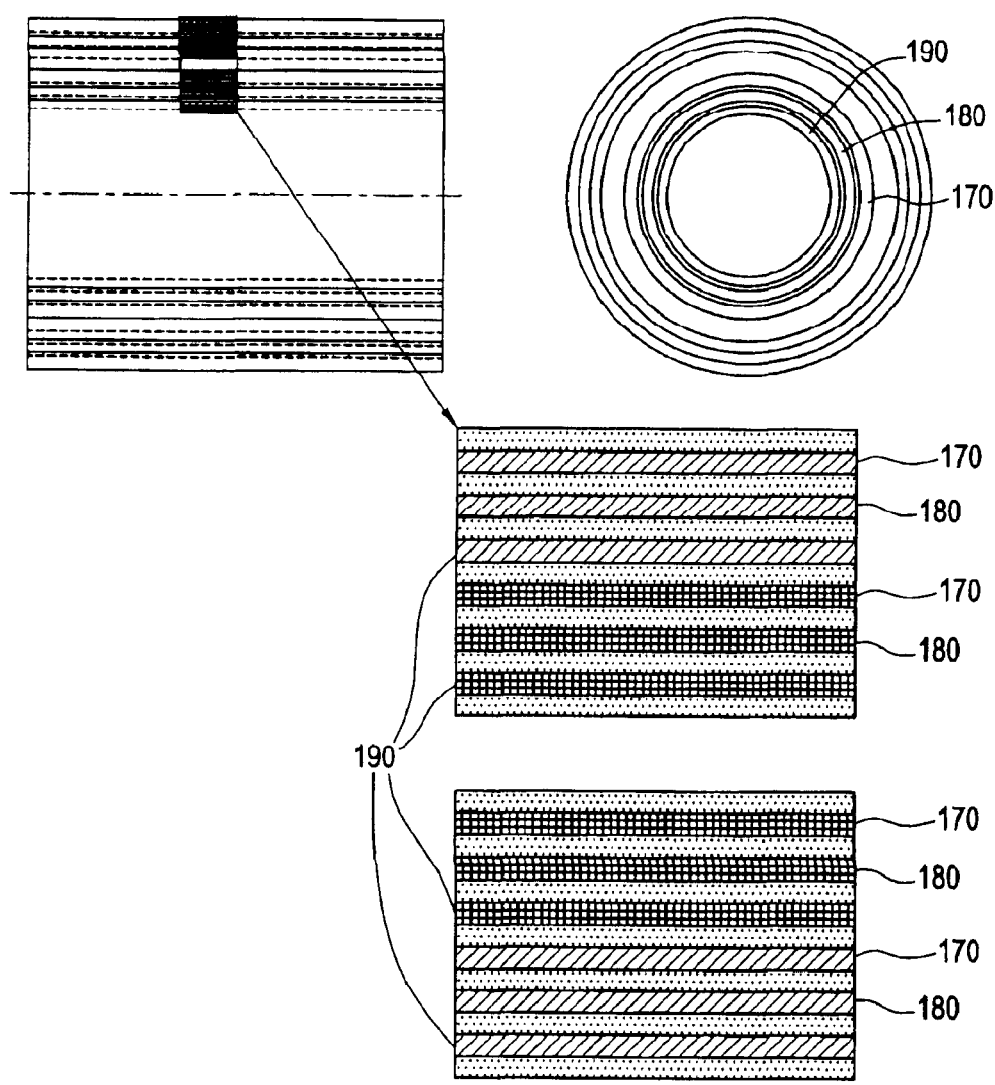
FIG. 6 depicts a cross section of a gradient coil representation for a self-shielded "twin" or dual field of view gradient coil.
Figure 7:
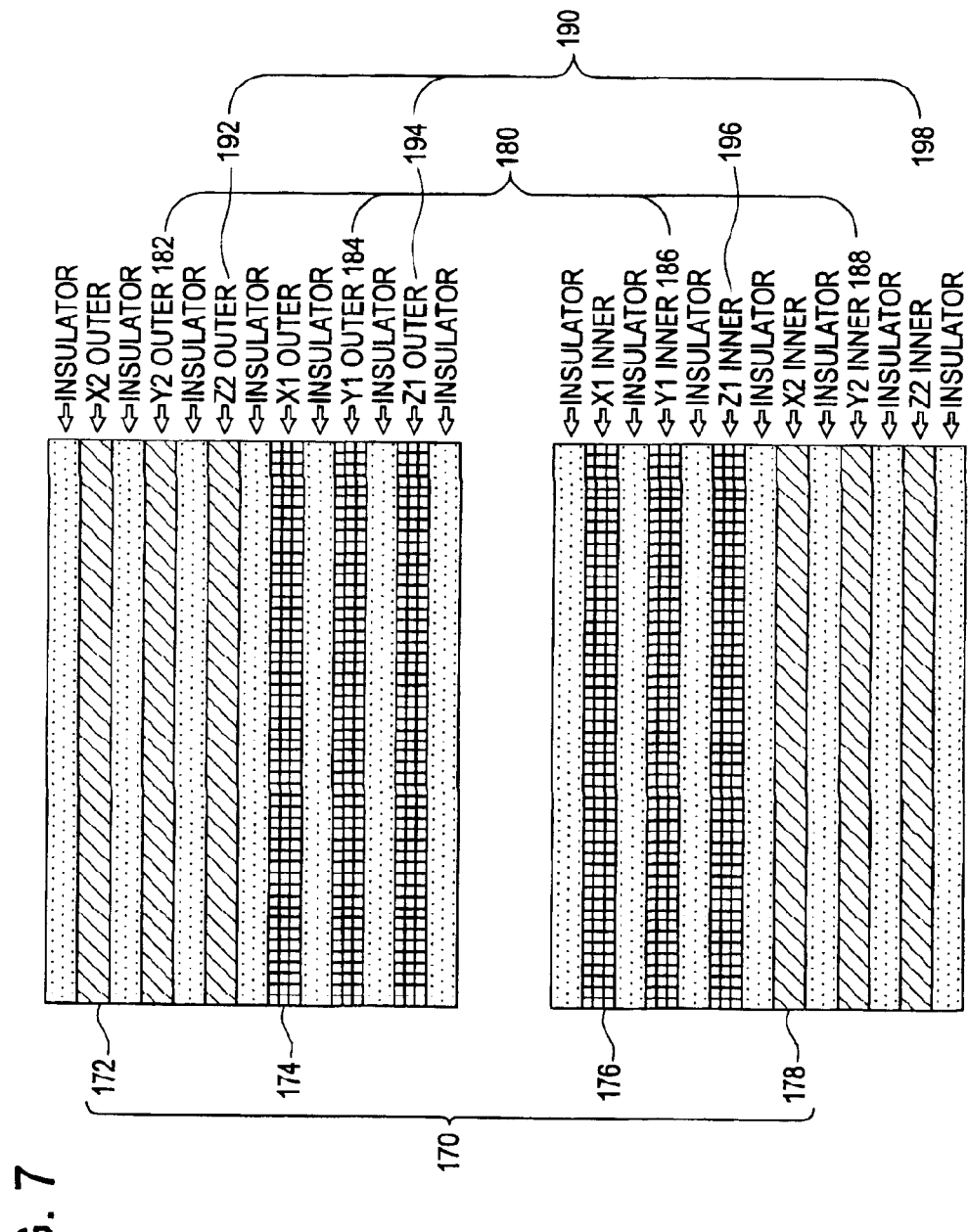
FIG. 7 provides a more detailed depiction of the cross-section of FIG. 6.

Referring to FIG. 6, a cross section of a gradient coil configuration is depicted for a "twin" or dual field of view gradient coil. FIG. 7 provides a more detailed depiction of the cross-section of FIG. 6. Also depicted in FIG. 7 is a depiction of the layers within the cross-section and their respective distances from the center of the gradient coil assembly 139. It will be evident from observation of FIG. 7, that 12 layers of coils total are employed. Namely and denoted in the figures: X2 172, Y2 182, and Z2 OUTER 192; X1 174, Y1 184, and Z1 OUTER 194; X1 176, Y1 186, and Z1 INNER 196; and X2 178, Y2 188, and Z2 INNER 198. Where X2 OUTER 172, X1 OUTER 174, X1 INNER 176, and X2 INNER 178 and combine to form second gradient coil 170. Similarly, Y2 OUTER 182, Y1 OUTER 184, Y1 INNER 186, and Y2 INNER 188 and combine to form third gradient coil 180. Likewise, Z2 OUTER 192, Z1 OUTER 194, Z1 INNER 196, and Z2 INNER 198 combine to form first gradient coil 190. Additionally, it will be appreciated that there are also included various layers for bonding, insulation, cooling and the like.

Continuing with FIG. 7 and referring as well to FIG. 8, the coil configuration employing the simplification of an exemplary embodiment is depicted. The windings for the X1 (e.g., 174, 176) and Z1 (194, 196) coils have been eliminated. As stated earlier, it should be evident now, that the elimination of these coils as depicted leaves open space, which may now be utilized to enhance the gradient coil assembly 139.

The power needed to drive a gradient coil is proportional to the fifth power of the coil radius. Elimination of the X1 windings allows the Y coil radius to shrink, resulting in a Y coil that requires less power. For example, a seemingly insignificant reduction in radius of 3% results in a reduction of needed power by 14%. When several coil windings can be eliminated, the radius of the outermost coil is reduced the most with the consequential greatest reduction in needed power.

The elimination of unnecessary coil windings benefits the control of excessive gradient coil temperatures in two ways. First, the coils require less power and dissipate less heat through resistive losses. Second, the coil windings must be electrically insulated from each other. Electrical insulation also tends to be good thermal insulation. Elimination of coil windings also eliminates the insulation layers that were needed for the windings. There is less thermal resistance to the heat generated within the coil. More heat can be extracted by whatever cooling system is employed.

Turning now to FIG. 9, a cross-section of a gradient coil assembly 139 of an exemplary embodiment is depicted. In this figure, a representation of the gradient coils rearranged to take advantage of the spacing made available by eliminating the X1 (e.g., 174, 176) and Z1 (194, 196) coils. It will be appreciated that in this exemplary embodiment, the Y1-axis coil (184, 186) has been repositioned. The reduction in the in the diameter for the Y1 inner coil 186 increases efficiency. Likewise, moving the Y1-outer coil 184 farther away from the Y1 inner coil 186 also increases efficiency. Finally, the overall build up for the inner and outer coils may be reduced if desired.

Turning now to FIG. 10, a cross-section of a gradient coil assembly 139 for an alternative embodiment is depicted. In this figure, a representation of the gradient coils employing a "tapped" Y-axis gradient coil (e.g., 182, 184, 186, 188) is rearranged to take advantage of the spacing made available by eliminating the X1 (e.g., 174, 176) and Z1 (194, 196) coils. It will be appreciated that in this exemplary embodiment, If the Y1-axis operation is achieved by tapping the Y2-axis coil, 182, 188 then a separate inner Y1 axis coil 186 is no longer needed, resulting in increased efficiency and additional saved space. However, depending upon the selected configuration, a separated Y1-axis outer coil 184 may still be needed to address when the Y2 coil (e.g., 182, 184, 186, 188) is operating in a tapped mode.

The system and methodology described in the numerous embodiments hereinbefore provides a system and method including a gradient coil that facilitates MR imaging avoiding peripheral nerve stimulation (PNST), and potentially increasing gradient slew rates for reduced overall imaging durations. In addition, the disclosed invention may be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium such as 111 and 112, wherein, when the computer program code is loaded into and executed by a computer, the computer becomes an apparatus for practicing the invention. The present invention can also be embodied in the form of computer program code, for example, whether stored in a storage medium 111, 112, loaded into and/or executed by a computer, or as data signal 110 transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for decreasing gradient field pulse sequence duration for a magnetic resonance imaging system, the method comprising:
    establishing an allowable gradient field strength for an axis of a plurality of axes for a field of view;
    applying a weighting factor associated with each said axis of said plurality of axes;
    establishing a slew rate responsive to a selected axis of said plurality of axes that exhibits a largest gradient field strength in light of said weighting factor and said field of view; and
    operating said plurality of axes at said largest gradient field strength.

2. The method of claim 1 wherein said establishing is responsive to an effective gradient coil length.

3. The method of claim 1 wherein said weighting factor is one of a plurality of weighting factors corresponding to comparative allowable gradient field strengths among said plurality of axes.

4. The method of claim 1 wherein said plurality of axes correspond to an X, Y, and Z axes of said magnetic resonance imaging system.

5. The method of claim 1 wherein said operating includes limiting a gradient field strength of only said selected axis of said plurality of axes.

6. A method for reducing peripheral nerve stimulation for a magnetic resonance imaging system, the method comprising:
    establishing an allowable gradient field strength for an axis of a plurality of axes for a field of view;
    applying a weighting factor associated with each said axis of said plurality of axes;
    establishing a slew rate responsive to a selected axis of said plurality of axes that exhibits a largest gradient field strength in light of said weighting factor and said field of view; and
    operating said plurality of axes at said largest gradient field strength.

7. The method of claim 6 wherein said establishing is responsive to an effective gradient coil length.

8. The method of claim 6 wherein said weighting factor is one of a plurality of weighting factors corresponding to comparative allowable gradient field strengths among said plurality of axes.

9. The method of claim 6 wherein said plurality of axes correspond to an X, Y, and Z axes of said magnetic resonance imaging system.

10. The method of claim 6 wherein said operating includes limiting a gradient field strength of only said selected axis of said plurality of axes.

11. A storage medium encoded with a machine-readable computer program code;
    said code including instructions for causing a computer to implement a method for reducing peripheral nerve stimulation for a magnetic resonance imaging system, the method comprising:
    establishing an allowable gradient field strength for an axis of a plurality of axes for a field of view;
    applying a weighting factor associated with each said axis of said plurality of axes;
    establishing a slew rate responsive to a selected axis of said plurality of axes that exhibits a largest gradient field strength in light of said weighting factor and said field of view; and
    operating said plurality of axes at said largest gradient field strength.

12. A computer data signal comprising code configured to cause a processor to implement a method for reducing peripheral nerve stimulation in a magnetic resonance imaging system, the method comprising:
    establishing an allowable gradient field strength for an axis of a plurality of axes for a field of view;
    applying a weighting factor associated with each said axis of said plurality of axes;
    establishing a slew rate responsive to a selected axis of said plurality of axes that exhibits a largest gradient field strength in light of said weighting factor and said field of view; and
    operating said plurality of axes at said largest gradient field strength.

13. A system for decreasing gradient field pulse sequence duration and reducing peripheral nerve stimulation with known gradient pulse areas for a magnetic resonance imaging system, the method comprising:
    a means for establishing an allowable gradient field strength for an axis of a plurality of axes for a field of view;
    a means for applying a weighting factor associated with each said axis of said plurality of axes;
    a means for establishing a slew rate responsive to a selected axis of said plurality of axes that exhibits a largest gradient field strength in light of said weighting factor and said field of view; and
    a means for operating said plurality of axes at said largest gradient field strength.

* * * * *